United States Patent [19]
Moore

[11] Patent Number: 5,270,639
[45] Date of Patent: * Dec. 14, 1993

[54] TIME OF USE REGISTER FOR USE WITH A UTILITY METER

[75] Inventor: Lester C. Moore, West Lafayette, Ind.

[73] Assignee: Landis & Gyr Metering, Inc., Lafayette, Ind.

[*] Notice: The portion of the term of this patent subsequent to Nov. 19, 2008 has been disclaimed.

[21] Appl. No.: 2,407

[22] Filed: Jan. 8, 1993

Related U.S. Application Data

[63] Continuation of Ser. No. 749,658, Aug. 26, 1991, abandoned, which is a continuation of Ser. No. 410,805, Sep. 22, 1989, Pat. No. 5,066,906.

[51] Int. Cl.$^5$ ............................................... G01R 1/20
[52] U.S. Cl. ............................... 324/142; 324/103 R
[58] Field of Search ................. 324/142, 156, 157; 361/364, 366, 367, 372; 439/86, 89-90; 364/481, 483; 340/870.02, 870.28, 870.29

[56] References Cited

U.S. PATENT DOCUMENTS

| | | | |
|---|---|---|---|
| 4,202,588 | 5/1980 | Dalamangas et al. | 439/91 |
| 4,783,623 | 11/1988 | Edwards et al. | 324/156 |
| 5,066,906 | 11/1991 | Moore | 324/142 |

Primary Examiner—Vinh Nguyen

Attorney, Agent, or Firm—Woodard, Emhardt, Naughton, Moriarty & McNett

[57] ABSTRACT

A time of use register for use in an electronic watthour meter is formed of a three piece interlocking construction without the use of separate fasteners or the use of tools for assembly. The TOU register includes a front cover, a rear cover and a resilient clip, each of these components having various features to provide firm containment of a PC board and an LCD within the register. The front cover includes a window within which the LCD is positioned and a connector slot within which a resilient electrical conductor strip is situated. The electrical conductor strip provides communication between the PC board, which has a contact array at one edge of the board, and the LCD array, which also has a complementary contact array at its upper edge. The rear cover encloses the rear and part of the sides of the TOU register and includes a number of stops for providing uniform pressure against the PC board to hold it in position. The front and rear covers include a number of catches upon which the resilient clip, and particularly a number of notches on the resilient clip, is snapped. When the resilient clip is snapped onto the notches of the front and rear covers, a specific amount of pressure is exerted against the components contained within the TOU register. The pressure is calibrated to provide a uniform compression of the resilient connector strip to insure a gas-tight electrical connection between the PC board and the LCD array.

12 Claims, 3 Drawing Sheets

TIME OF USE REGISTER FOR USE WITH A UTILITY METER

This application is a continuation of application Ser. No. 07/749,658, filed Aug. 26, 1991, now abandoned, which is a continuation of application Ser. No. 07/410,805, filed Sep. 22, 1989 now U.S. Pat. No. 5,066,906.

BACKGROUND OF THE INVENTION

The present invention relates generally to utility meters for recording energy consumption and to a device for registering time of energy use information. The invention more specifically concerns a time of use register that is readily installed within standard electric meters.

Conventional electric meters employ a metal disk driven as a rotor of a small induction motor by an electric field at a speed which is proportional to the electric power being consumed by a load. The electric meters include some means, whether mechanical or electronic, for integrating the disk motion to indicate the total energy consumed, generally measured in kilowatt hours.

In addition to the energy consumption measurement, some electric meters contain means for separating the electric energy consumption into consumption occurring during certain time periods. These meters determine electric energy consumption during predetermined peak and off-peak hours as well as record maximum demand over a specific time period in order to adjust billings to the customer according to these parameters.

In some electric meters, separate time-of-use (TOU) registers are provided that are electrically connected to the electric meter. Typically, these meters may include electronic or solid state registers. The time-of-use registers themselves include digital electronics, generally mounted on a printed circuit board. In addition, the TOU registers include some form of display, usually a liquid crystal (LCD) display. In many instances, the LCD array is the component of the time of use meter that is most susceptible to failure. This presents a problem to field service personnel because service of TOU registers usually requires the use of tools to remove and disassemble the TOU register in order to access the defective LCD array. In addition, many TOU registers of the prior art require either replacing the LCD and a printed circuit board to which the LCD array is attached by a cable, or severing the electrical connection from the LCD array to the printed circuit board and resoldering the connection to a replacement LCD array. In either case, service of these types of TOU registers is often time-consuming, expensive, and laborious to field service personnel.

Thus, there is a need for a time of use register that is easily serviceable without the necessity of tools and without complicated assembly/disassembly procedures. There is also a need for a readily serviceable TOU register in which the LCD array or other similar display component, is easily removed and replaced without requiring replacement of the printed circuit board or cumbersome re-connection of a new LCD to the board.

SUMMARY OF THE INVENTION

A time of use register for use in an electronic watthour meter is formed of a three piece interlocking construction without the use of separate fasteners or the use of tools for assembly. The TOU register includes a front cover, a rear cover and a resilient clip, each of these components having various features to provide firm containment of a PC board and an LCD within the register. The front cover includes a window within which the LCD is positioned and a connector slot within which a resilient electrical conductor strip is situated. The electrical conductor strip provides communication between the PC board, which has a contact array at one edge of the board, and the LCD array, which also has a complementary contact array at its upper edge.

The rear cover encloses the rear and part of the sides of the TOU register and, in one aspect of the invention, includes a number of stops for providing uniform pressure against the PC board to hold it in position. The front and rear covers include a number of catches upon which the resilient clip, and particularly a number of notches on the resilient clip, is snapped. When the resilient clip is snapped onto the notches of the front and rear covers, a specific amount of pressure is exerted against the components contained within the TOU register. The pressure is calibrated to provide a uniform compression of the resilient connector strip to insure a gas-tight electrical connection between the PC board and the LCD array.

It is one object of the present invention to provide a time-of-use register that can be readily assembled and disassembled without the use of tools or without the need to remove separate fasteners.

It is a further object to provide a time-of-use register that includes means for easily and readily removing a display, such as an LCD, from the register for replacement with a new display. Another object is to provide a register construction that will insure a gas-tight seal at the electrical connection of an electrical connector to the display and to the register PC board.

Further objects and benefits of the present invention can be ascertained from the following disclosure and accompanying figures.

DESCRIPTION OF THE PREFERRED EMBODIMENT

Figure 1:
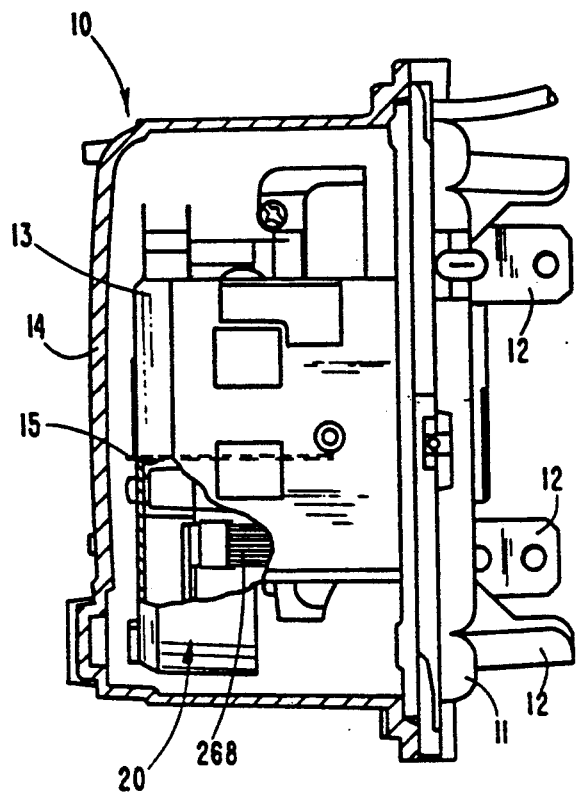
FIG. 1 is a side view of an electronic watthour meter with the time of use register of the present invention attached thereto.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

FIG. 1 illustrates a conventional watthour meter 10 in which a base plate 11 includes a set of plug-in conductors 12 for interposition between a source of AC electrical energy and a load in a conventional fashion. The watthour meter 10 includes a mechanical register 13, which in the preferred embodiment is an electric KWH register, and which includes means for determining electrical energy use by the load. A cover 14 is provided to shroud the components of the watthour meter 10 and is fitted onto the base plate 11 in a conventional fashion. The watthour meter 10 further includes a conventional meter disc 15 that rotates according to the rate of electrical energy use.

The meter disc 15 is visible through a disc cutout 16a in a nameplate 16 that is mounted over the demand register. The nameplate 16 further includes a display cutout 16b through which a display from the time of use register is visible. The nameplate further includes an optical port cutout 16c through which an optical communications port of the time-of-use (TOU) register can extend. Finally, the nameplate 16 includes a pair of mounting holes 16d for attachment of the nameplate 16, as well as the TOU register described herein, to the register 13.

The watthour meter 10 of the present invention also includes a follower disc 19 that is mounted on a common spindle to the meter disc 15. The follower disc 19 is preferably of a smaller diameter than the meter disc 15 for use in connection with the TOU register as described herein.

The watthour meter 10 of the present invention includes a TOU register 20 which is physically and electrically connected to the register 13. The details of the TOU register 20 are shown in the exploded perspective view of FIG. 3. The TOU register generally includes a front cover 22, a complementary configured interlocking rear cover 24 and a printed circuit (PC) board 26 which is contained within the front and rear covers. An LCD array 28 is carried by the front cover 22. A resilient clip 30 fits over the assembled front and rear covers to contain the printed circuit board and LCD array and to clamp the covers together. A flexible connector strip 32 is included to provide an electrical connection between the LCD array and the printed circuit board 26.

Figure 2:
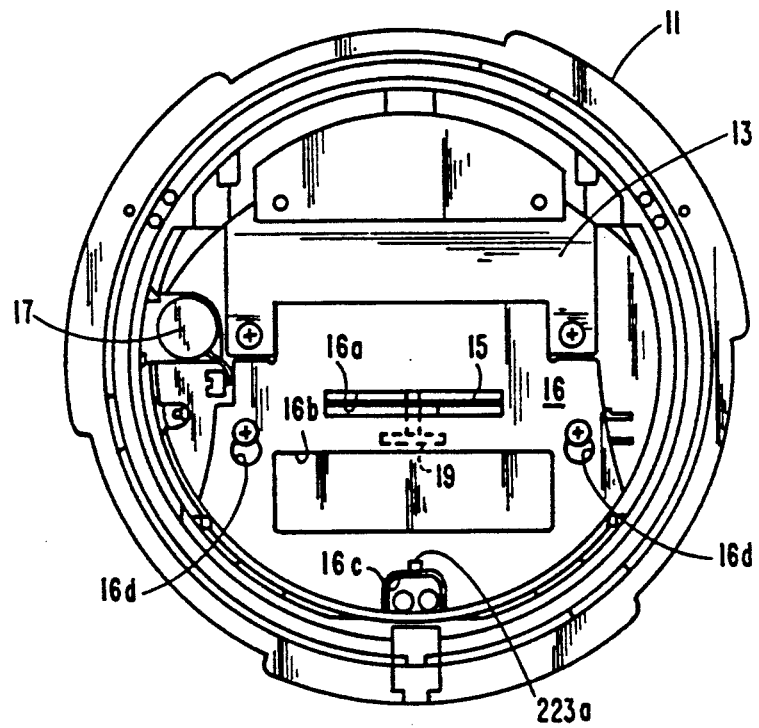
FIG. 2 is an front elevational view of the watthour meter of FIG. 1.
Figure 3:
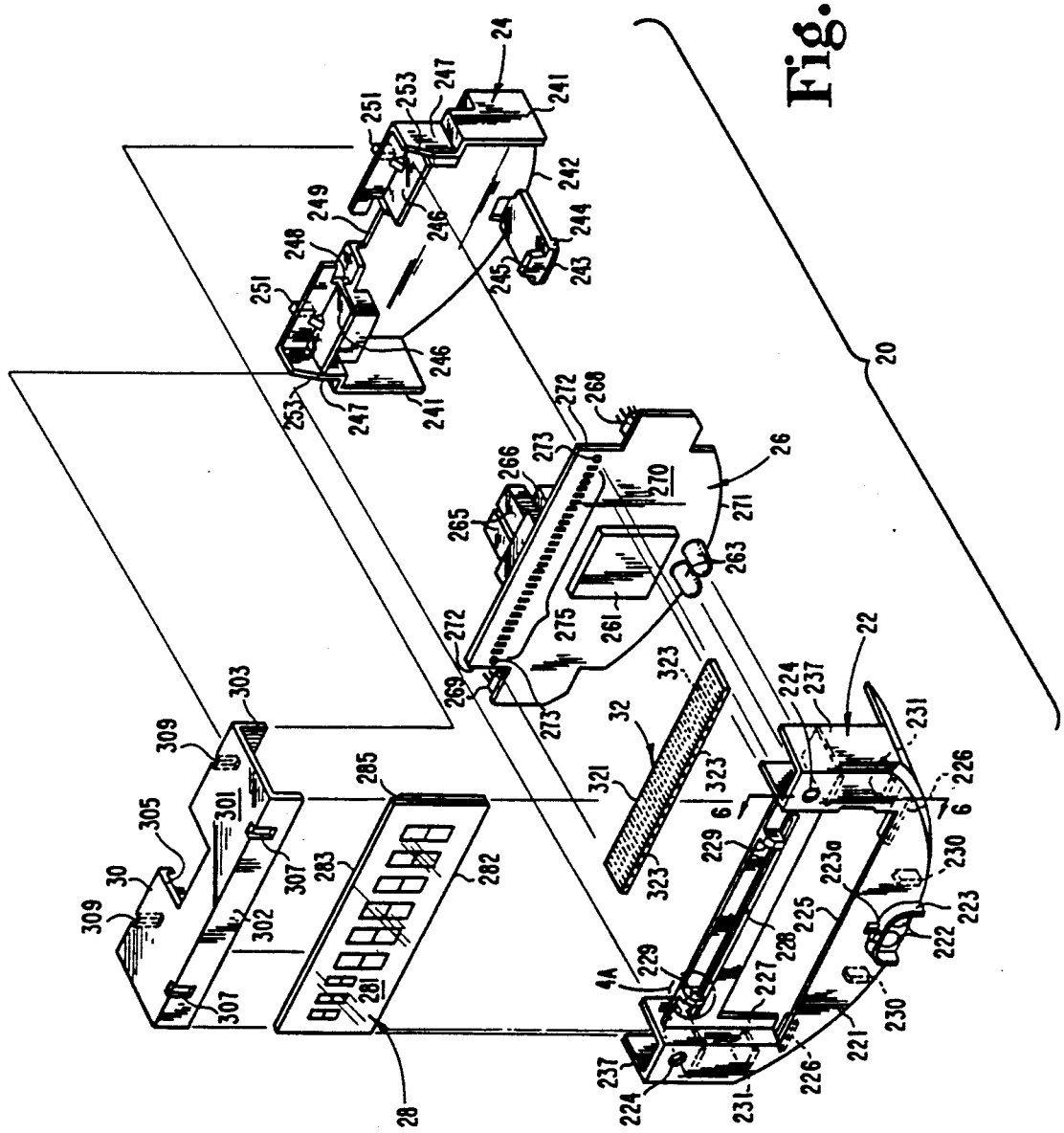
FIG. 3 is an exploded perspective view of the components of the time of use register of the present invention.

The structure of each of the specific components of the TOU register 20 will now be described in more detail. The front cover is shown in FIG. 3 and in the perspective view of FIG. 4. The front cover 22 includes a front panel 221 which has a pair of optical coupler ports 222 formed therein at the bottom of the front face. A shield 223 surrounds the coupler ports 222 to provide some protection against ambient light that might disturb optical communications through the parts between the TOU register 20 and an external hand-held reader that is conventional in the art. The shield 223 includes a tab 223a that is used to engage the nameplate 16 at the optical port cutout 16c. The front panel 221 also includes a pair of mounting holes 224 that are positioned to correspond with the mounting holes 16d in the nameplate 16 to provide a means for connecting the TOU register 20 to the demand register 13. As shown in FIGS. 1 and 2, a pair of screws are preferably used to connect the nameplate and TOU register to the demand register; however, other fasteners may be suitable to effect this connection.

The front panel 221 of the front cover 22 includes an LCD window 225 within which the LCD array resides and is visible through. A pair of support ledges 226 are formed beneath and at opposite sides of the LCD window 225. When the TOU register is assembled, the LCD array 28 rests upon the support ledges 226. The front cover 22 also includes a rear support panel 227 for providing rearward support for the LCD array. A connector slot 228 is formed through the upper portion of the support panel 227. Immediately above the connector slot 228 are two spaced-apart projections 229 extending forward from the face of the front panel 221. The details of the projections 229 are shown more clearly in the enlarged view of FIG. 4A. The projections 229 includes a lower edge 229a that acts as an upper stop for the LCD array 28 when the array is resting on the support ledges 226. The upper edge of the projections is beveled at a cam edge 229b which is provided to facilitate snapping the resilient clip 30 onto the front and rear covers, as described more fully herein.

Figure 4:
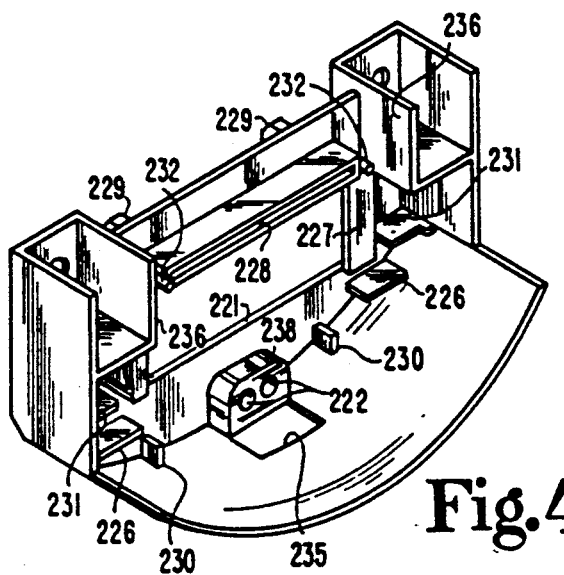
FIG. 4 is a rear perspective view of the front cover of the time of use register shown in FIG. 3.
Figure 4A:
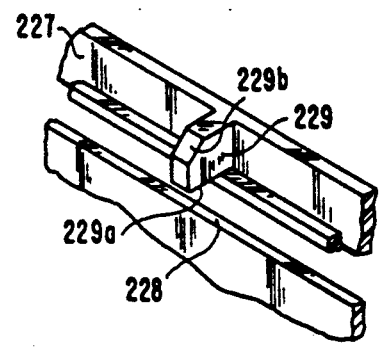
FIG. 4A is an enlarged perspective view of a portion of the front cover, as taken from region 4A in FIG. 3.

The rear surface of the front panel 221 is shown more clearly in FIG. 4. A pair of printed circuit board stops 230 are provided at the lower portion of the rear face of the front panel 221. A second pair of circuit board stops 231 are also provided at opposite sides of the front panel generally midway toward the upper edge of the front cover 22. A pair of cylindrical guide pins 232 project rearward from the rear face of the front panel 221 at opposite sides of the connector slot 228. Each of the stops 230, stops 231 and guide pins 232 provide means for supporting the printed circuit board 26. The printed circuit board includes a plate 270 upon which the electrical components are mounted. The plate includes a lower edge 271 which rests upon the lower stops 230 of the front cover 22 and a pair of spaced-apart pin openings 273 which are adapted to engage the guide pins 232.

The front cover 22 includes a bottom panel 234 which is generally semi-cylindrical in shape and extends from the lower edge of the front panel 221. The bottom panel 234 includes a spring clip notch 235 formed therein for engagement with a spring clip on the rear cover 24. Also formed between the rear surface of the front panel 221 and the upper face of the bottom panel 234 is a boss 238 through which the optical coupler ports 222 are formed. The boss 238 provides means for supporting a pair of optical communication lamps 263 that are mounted on the printed circuit board 26.

The front cover 22 also includes a pair of side panels 237 which partially enclose the sides of the assembled TOU register 20. A pair of interlocking shoulders 236 are formed at a right angle to the side panels 23 inboard of the side panels at either side of the front cover. The interlocking shoulders 236 are configured to mate with corresponding complementary shaped indentations 247 formed in the rear cover 24.

Referring again to FIG. 2, the rear cover 24 includes a side panel 241 which is situated inboard of the side wall panel of the front cover 22 when the covers are interlocked. The side panel 241 is formed into a complementary-shaped interlocking indentation 247 which is adapted to engage a portion of the interlocking shoulder 236 of the front cover. The lower edge 242 of the rear cover 24 is formed in a semi-circular shape to conform to the shape of the bottom panel 234 and to provide a tight interface between the front and rear covers at this location when the TOU register is assembled.

A spring clip 243 projects forward from the lower edge 242 of the rear cover and has a length sufficient to engage the notch 235 formed in the bottom panel 234 of the front cover. The spring clip 243 includes a catch 244 formed at the end of the clip to engage the inner edge of the notch 235. The upper surface of the spring clip is formed into a stop 245 which presses against the rear face of the plate 270 of the printed circuit board 26 to push the lower portion of the PC board 26 forward. This feature holds the board firmly within the TOU register 20 and maintains the optical communication lamps 263 fully within the optical coupler ports 222 in the boss 238. The front face of the rear cover 24 also includes a pair of stops 246 near the top of the rear cover to provide additional support to the top of the printed circuit board 26.

The rear cover 24 also includes a pair of cutout portions to accommodate the follower disc and optical sensor of the TOU register. A follower disc cutout 248 provides access for the follower disc 19 to rotate between a pair of photosensors 265 mounted on the PC board 26. A second cutout 249 is provided for the photosensors to extend through when the TOU register is fully assembled. The photosensors 265 must be accessible outside the TOU register so that the follower disc 19 can rotate between the sensors.

Figure 5:
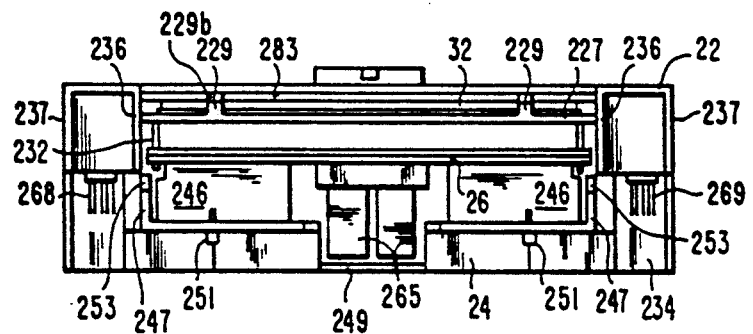
FIG. 5 is a top elevational view of the time of use register of FIG. 3 in a partially assembled configuration.

The rear cover 24 further includes a pair of resilient clip catches 251 that are formed on the rear face of the rear cover, as shown more clearly in FIG. 5. The catches 251 interlock with the resilient clip as described more fully herein. The side panels 241 of the rear cover include a release cam edge 253 defined by an angled portion at the top of the front edge of the side panels 241. Each release cam edge 253 facilitates disassembly of the TOU register, as described herein.

The printed circuit board 26 includes a number of integrated circuits 261 mounted on the plate 270. The optical communication lamps 263 are mounted on the front face of the plate 270 as described above. The pair of photosensors 265 are mounted at the top of the rear face of the plate 270. A follower disc slot 266 is formed between the spaced-apart components of the photosensors 265 so that the follower disc 19 can rotate between the sensor elements. The PC board 26 includes a pair of electrical connectors 268 and 269 mounted on opposite sides of the printed circuit board. These connectors 268 and 269 provide means for making electrical connection with the demand register 13. This electrical connection can be used to provide power from a power transformer in the electric meter to the TOU register, or to provide from a backup battery in the register, or to provide other electrical signals and communication between the TOU and the demand registers. In the preferred embodiment, the connectors 268 and 269 are multi-prong connectors because of the ease of pressing the connectors into fixed leaded connectors on the meter 10. The connectors 268 and 269 are disposed outside the side walls 241 of the rear cover 24, since these connectors must be accessible external to the TOU register for connection to the meter.

The printed circuit board 26 further includes a pair of interlocking notches 272 at either side of the plate 270. The notches 272 provide clearance between the PC board and the interlocking shoulders 236 of the front panel 221. Thus, the notches 272 provide a positive means for orienting the PC board within the TOU register during assembly.

At the top of the PC board 26 is an electrical contact array 275. This array provides a number of linearly spaced-apart contacts for providing electrical communication with the LCD 28. The LCD 28 includes a display screen 281 which is visible through the window 225 of the front cover 22 in the assembled TOU register. The LCD has a lower edge 282 which rests upon the support ledge 226 and a top edge 283 that is guided by the LCD stops 229 of the projections 229. The rearward facing portion adjacent the top edge 283 of the LCD array 28 includes a contact array 285. The contact strip 285 includes a row of spaced-apart irridium contacts on the glass face of the LCD which are arranged to correspond to the row of contacts forming the contact array 275 of the PC board 26.

Electrical connection between the LCD contact array 285 and the PC board contact array 275 is made through a resilient electrical connector strip 32. The connector strip 32 is composed of a resilient and compressible carrier material 321 and a number of conductive strands 323 embedded therein. The resilient connector strip 32 is inserted into the connector slot 228 in the front cover when the LCD array is positioned within the window 225 of the front cover 22. The electrical interface between the connector strip 32 and the two contact arrays 275 and 285 must be fluid and gas-tight in order to insure the integrity of the electrical information transmitted between the LCD from the PC board is correct. Thus, the resilient connector strip 32 must be uniformly compressed between the contact arrays of the PC board 26 and the LCD 28. For these reasons, the connector carrier material 321 is a generally elastomeric material that is readily compressible. The interlocking features of the front and rear covers 22 and 24 and the resilient clip 30, along with the several stops formed in the rear cover that push against the PC board, are configured to provide a proper and uniform pressure to compress the connector strip 32 while it resides within the connector slot 228.

The resilient clip 30 is provided to completely enclose and clamp the components of the TOU register 20. The resilient clip includes a top panel 301 which covers the top of the TOU register. A front flange 302 and a rear flange 303 projecting down from the top panel 301 so that the resilient clip 30 forms an elongated U-shaped clamp. A photosensor cutout 305 is formed in the top panel and the rear flange 303 to accommodate the photosensors 265 mounted on the PC board and to provide access for the spindle upon which the follower disc 19 is mounted.

A pair of front catch notches 307 are formed at the upper edge of the front flange 302. A pair of rear catch notches 309 are formed at the upper edge of the rear flange 303. The front catch notches 307 engage about the projections 229 on the rear support panel 227 of the front cover 222. The rear catch notches 309 engage about the resilient clip catches 251 at the upper edge of the rear cover 24.

The resilient clip 30 is designed to snap over the top edges of the front and rear covers 22 and 24 when they are interlocked. The respective front and rear catches snap into the notches 307 and 309 to complete the assembly of the TOU register 20. The dimensions of the resilient clip, and particularly the distance between the front flange 302 and the rear flange 303, are carefully calibrated to provide the proper amount of compression of the components of the TOU register. Adequate compression is necessary to uniformly compress the flexible connector strip 32 between the PC board and the LCD, and to restrain the components, such as the PC board 26 and the LCD 28, from unnecessary and undue motion within the TOU register 20.

FIG. 5 shows a partial cutaway view of the partially assembled TOU register before the resilient clip 30 has been snapped on. The complementary interlocking features of the rear cover 24 and the front cover 22 is apparent, particularly at the interlocking shoulder 236 and indentation 247. It is also seen that the PC board stops 246 of the rear cover 24 press the PC board 26 against the connector slot 228 to hold the PC board in position, and to apply uniform pressure to the flexible connector 32 situated within the connector slot 228. It should be noted, however, that attachment of the resilient clip 30 is required to press the LCD 28 toward the connector strip 32. The lower portion of the front flange 302 reacts against the LCD 28 to hold the LCD in place.

The design of the TOU register 20 of the present invention greatly facilitates the assembly and disassembly of the register by field personnel. In assembling the register, the LCD 28 is first inserted into the window 225 of the front cover 22. The array is inserted so that the electrical contact array 285 is facing rearward toward the opening of the connector slot 228. When the LCD 28 is improperly positioned within the window 225, eventual complete assembly of the TOU register 20 is very difficult without damage to the TOU components. Thus, a fail-safe measure is provided to insure that the register is assembled correctly every time. Once the LCD is in position, the flexible connector strip 32 is inserted into the connector slot 228 so that the conductive strands 323 contact the electrical contact array 285 of the LCD.

The next step is to insert the PC board 26 such that the optical communication lamps 263 fit within the coupler ports 222 of the boss 238 at the base of the front cover 22. At the same time, the pin openings 273 in the PC board are engaged about the guide pins 232 extending from the front cover at either side of the connector slot 228. The interlocking notches 272 of the PC board provide further insurance that the board is properly positioned within the front cover 22. When the PC board is installed in this manner, the contact strip 275 at the top of the PC board 26 is automatically in direct electrical contact with the conductor loops 323 of the resilient connector strip 32.

With the PC board in place, the rear cover 24 can be interlocked with the front cover 22 by simply placing the lower edge 242 of the rear cover on the bottom panel 234 of the front cover. The spring clip 243 can be moved forward along the bottom panel 234 until the catch 244 engages within the spring clip notch 235 in the bottom panel. In addition, the interlocking indentations 247 at the side panels 241 of the rear cover will be automatically situated adjacent the interlocking shoulders 236 of the front cover. If the rear cover properly is positioned, the follower disc cutout 248 should align with the follower disc slot 266 between the photosensors 265 mounted on the PC board 26. In addition, the photosensor cutout 249 should provide an opening through which the photosensors 265 extend. At this point, the assembled TOU register 20, absent the rear cover 24, appears as shown in FIG. 5. The addition of the rear cover then provides the proper clamping force to hold the TOU register together without separate fasteners and provides the proper pressure to insure a uniform gas-tight electrical connection between the PC board and the LCD array effected by the connector strip 32.

To install the resilient clip 30, the rear flange 303 is placed against the rear cover 24 with the rear catch notches 309 engaged about the resilient clip catches 251. The resilient clip 30 can then be snapped or pressed onto the top edges of the front and rear covers when the front and rear covers are slightly compressed. The cam edges 229b of the projections 229 facilitate the attachment of the front catch notches 307 onto the projections 229 of the front cover 22. A moderate amount of downward pressure will cause the front flange 302 to slide along the cam edges 229b until the projections 229 are fully situated within the front catch notches 307. The assembly of the TOU register is then complete. No separate fasteners are required to keep the TOU register assembled and, thus, no tools are required to assemble the register.

Figure 6:
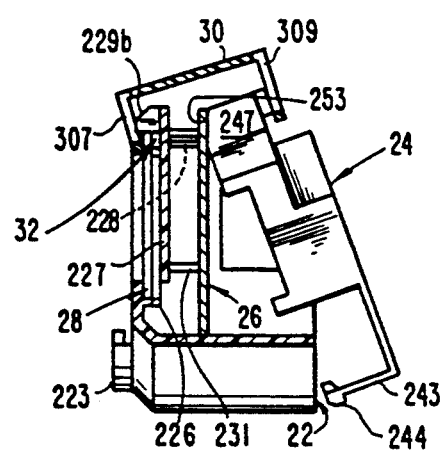
FIG. 6 is a side partial cross-sectional view of the time-of-use register of FIG. 1 taken along Line 6—6 in FIG. 1 as viewed in the direction of the arrows, shown in a partially disassembled configuration.

One unique aspect of the present invention is the ease with which the TOU register can be disassembled. The disassembly of the register begins by depressing the spring clip 243 of the rear cover 24 which releases the catch 244 from the spring clip notch 235 in the bottom panel 234 of the front cover 22. As the spring clip 243 is released, the stored compression of the TOU register components has a tendency to cause the rear cover 24 to rotate rearward about the rear catch notch 309 and resilient clip catch 251 of the rear cover. As the rear cover rotates, the release cam edge 253 provides clearance for the front edge of the side panels 241 relative to the PC board 26 and the front cover 22 as shown in FIG. 6. When the rear cover 24 has been sufficiently rotated to clear at least the PC board, the resilient clip catches 251 disengage from the rear catch notches 309 to permit the resilient clip 30 to be removed. The remaining components of the TOU register 20 can then be easily extracted from the front cover 22.

It is apparent that this structure of the TOU register 20 of the present invention represents an important stride in facilitating the field service of TOU registers. It should be understood, of course, that other types of registers may be configured in the same manner and that other types of circuit boards and electrical components may be housed within the front and covers, and the resilient clip of the register of the present invention and still fall within the scope of the invention. It is also understood that not all components of the preferred embodiment of the TOU register need be included. For instance, the optical coupling lamps and associated ports and boss may be eliminated.

The front and rear covers and resilient clip of the TOU register 20 are preferably composed of a high-strength, impact resistant, durable plastic, such as a polycarbonate or a polyethylene. These components can be readily formed by injection molding and are not susceptible to failure, at least during the typical life of a watthour meter.

The resilient connector strip 32 can be composed of a resilient material, such as an elastometer. The conductive strands 323 within the carrier material 321 are also preferably resilient so that they can endure axial compression as the contact strip 32 is compressed between the PC board and the LCD array. The connector strip 32, as well as the LCD 28, can be of the type generally readily commercially available in the market. The PC board 26 can be configured in whatever shape is necessary to accommodate the functions of the TOU register. The shape of the overall TOU register 20 may also be modified according to the needs of the particular watthour meter to which the TOU register 20 is to be mounted. However, the basic structure and function of the three piece TOU register will remain intact, regardless of variations in shape and general configuration of the components.

While the invention has been illustrated and described in detail in the drawings and foregoing description, the same is to be considered as illustrative and not restrictive in character, it being understood that only the preferred embodiments have been shown and described and that all changes and modifications that come within the spirit of the invention are desired to be protected.

What is claimed is:

1. A register for use with an electric meter having a meter disc for registering electrical energy usage, comprising:
   a circuit board having electronic circuitry for registering electrical energy usage;
   a display;
   a compressible electrical conductor between said circuit board and said display for operation of said display; and
   a resilient clamping mechanism operable in a clamping position to clamp said display, said circuit board and said electrical conductor together while compressing said electrical conductor in electrical contact between said display and said circuit board, and in an unclamped position to release said electrical conductor from electrical contact with said display and said circuit board to permit ready removal of said display from the register.

2. The register of claim 1, further comprising:
   means for receiving electrical signals including;
   a slave disc;
   a number of photo-sensors mounted on said circuit board; and
   a shaft connecting said slave disc to the meter disc underneath the meter disc so that said slave disc is rotatable with the meter disc adjacent said number of photo-sensors;
   wherein said photo-sensors include means for generating electrical pulses provided to said circuit board according to the rate of rotation of said slave disc.

3. The register of claim 1, wherein:
   said display includes a first contact array;
   said circuit board includes a second contact array;
   said electrical conductor includes a number of electrically conductive loops embedded in a resilient strip; and
   further wherein the register additionally includes means for supporting said electrical conductor such that one end of said loops contacts said first contact array while the other end of said loops contacts said second contact array.

4. The register of claim 1, wherein said resilient clamping mechanism includes:
   a housing supporting said display and containing said circuit board and said electrical conductor, said housing including a first cover and a second cover; and
   a resilient U-shaped clip engaged over said first and second covers to clamp a portion of said first cover between said display member and said second cover.

5. A register for use with an electric meter for registering electrical energy usage, comprising:
   a display;
   a housing for removably containing said display, said housing including a first cover and a second cover, said first cover having a first and a second side and said second cover having a first and second side;
   first latch means, disposed between said first side of said first cover and said first side of said second cover, for engaging said first and second covers at their respective first sides;
   second latch means, disposed between said second side of said first cover and said second side of said second cover, for engaging said first and second covers at their respective second sides;
   wherein said first latch means and said second latch means are operable in a latched position to engage said first cover with said second cover about said display and in an unlatched position to permit removal of said display, and
   further wherein only one of said first latch means and said second latch means is operable to permit disengagement of said first cover from said second cover.

6. The register of claim 5 wherein:
   said first latch includes a resilient finger extending from either said first cover or said second cover and a notch defined in the other of said first cover or said second cover, wherein said resilient finger is engagable within said notch; and
   said second latch means is a resilient clip resiliently engagable about the second side of said first and second covers.

7. The register of claim 5, wherein:
   one of said first latch means or said second latch means is not operable unless the other of said first and second latch means is unlatched.

8. A register for use with an electric meter for registering electrical energy usage, the electric meter having a meter disc, and the register being adapted to be readily assembled and disassembled without the use of separate fasteners, comprising:
   a circuit board having electronic circuitry for registering electrical energy usage;
   a display;
   an electrical conductor;
   a housing including;
   a front cover having means for supporting said display;
   a back cover slidably interengagable with said front cover;
   complementary portions on said front cover and said back cover configured to support said circuit board therebetween and to restrain said circuit board against movement within said housing; and
   a resilient clamping mechanism operable to releasably clamp said front cover and said back cover together and said electrical conductor in electrical contact between said circuit board and said display for operation of said display.

9. The register of claim 8, wherein said resilient clamping mechanism includes:
   catch means between lower portions of said front cover and said back cover, said catch means including a resilient finger and notch arrangement wherein the finger is resiliently engageable within said notch;

a resilient clip adapted to span between said front cover and said back cover at top portions of both said covers; and snap-fit means between said clip and each said top portions of said front and back covers for snapping said clip over each said top portions to clamp said front and back covers together.

10. The register of claim 9, wherein said snap-fit means includes:
   a number of first catches on said top portion of said front cover;
   a number of second catches on said top portion of said back cover;
   said resilient clip defining a number of first notches and second notches corresponding to engagable with respective ones of said number of first and second catches.

11. The register of claim 10, wherein said snap-fit means includes a cam surface on one of said number of first catches and said number of second catches to facilitate engagement of said resilient clip.

12. The register of claim 9, wherein:
   said back cover includes a number of surfaces for supporting said circuit board, said number of surfaces having a cam surface adjacent the top portion of said back cover, whereby when said resilient catch is released from said notch, the back cover is pivotable about said resilient clip such that said cam surface provides clearance for said back cover to pivot relative to said circuit board.

* * * * *